United States Patent [19]

Nishimori et al.

[11] Patent Number: 5,107,327
[45] Date of Patent: Apr. 21, 1992

[54] PHOTOSEMICONDUCTOR DEVICE AND EPOXY RESIN COMPOSITION FOR USE IN MOLDING PHOTOSEMICONDUCTOR

[75] Inventors: Syuuji Nishimori; Tadaaki Harada; Yasuhiko Yamamoto; Nobuyuki Hiromori; Yasumori Yoshimura; Katsuya Muramatsu; Katsumi Shimada, all of Osaka, Japan

[73] Assignee: Nitto Denko Corporation, Osaka, Japan

[21] Appl. No.: 553,284

[22] Filed: Jul. 17, 1990

[51] Int. Cl.$^5$ .................. H01L 23/28; H01L 23/48; H01L 29/44; H01L 29/52
[52] U.S. Cl. .................... 357/72; 357/70; 174/52.2; 525/31; 525/481
[58] Field of Search .............. 357/72, 74, 73, 70; 174/52.2

[56] References Cited

U.S. PATENT DOCUMENTS

| | | | |
|---|---|---|---|
| 4,327,369 | 4/1982 | Kaplan | 357/72 |
| 4,663,190 | 5/1987 | Fujita et al. | 427/82 |
| 4,703,338 | 10/1987 | Sagami et al. | 357/72 |
| 4,926,239 | 5/1990 | Fujita et al. | 357/72 |

OTHER PUBLICATIONS

Database WPIL, No. 88-115956, Derwent Publications Ltd. London, GB & JP-A-63062363 (Nitto Electric Ind. K.K.).
Database WPI, No. 80-80854C, Derwent Publications Ltd., London GB, & DD-A-143839 (VEB Pentacon Dresden).
Patent Abstracts of Japan, vol. 10, No. 137 (E-405)(2194) May 21, 1986, & JP-A-61 001068 (Mitsubishi Denki K.K.) Jan. 7, 1986.

Primary Examiner—Rolf Hille
Assistant Examiner—David Ostrowski
Attorney, Agent, or Firm—Sughrue, Mion, Zinn, Macpeak & Seas

[57] ABSTRACT

A photosemiconductor device and an epoxy resin composition for use in molding a photosemiconductor used for the photosemiconductor device, the photosemiconductor device comprises a photosemiconductor element molded with a cured transparent epoxy resin composition, the cured transparent epoxy resin composition having a refractive index distribution curve characterized by the following (A), (B), and (C):

(A) the refractive index difference X between refractive index values (b) and (c), which respectively are lower and higher than refractive index value (a) corresponding to the maximum peak of the refractive index distribution curve and respectively correspond to those points on the refractive index distribution curve which have a relative height of 20 with the height of the maximum peak being taken as 100, is 0.0018 or less;

(B) the refractive index difference Y, which is the larger one of the difference between the refractive index values (a) and (b) and the difference between the refractive index values (a) and (c), is 0.0012 or less; and (C) in the case where the refractive index distribution curve has other peak or peaks than the maximum peak corresponding to the refractive index value (a), the refractive index difference Z, which is the largest one of the differences between the refractive index value (a) and refractive index values (d, ... d$_n$) corresponding to the other peak or peaks, is 0.0010 or less.

12 Claims, 4 Drawing Sheets

PHOTOSEMICONDUCTOR DEVICE AND EPOXY RESIN COMPOSITION FOR USE IN MOLDING PHOTOSEMICONDUCTOR

FIELD OF THE INVENTION

The present invention relates to a photosemiconductor device free of optical unevenness and an epoxy resin composition for use in molding a photosemiconductor used for the photosemiconductor device.

BACKGROUND OF THE INVENTION

Conventionally, photoreceiving elements such as solid stat image forming elements have generally been enclosed in ceramic packages in such a manner as to result in some spaces between the elements and the packages, to produce photosemiconductor devices. These ceramic packages, however, are undesirable because the constituent materials therefor are relatively expensive and large-scale production thereof is inefficient. Therefore, resin moldings for plastic packages have been studied. Of such resin molding techniques, molding with epoxy resin compositions in particular have been extensively studied. Such epoxy resin compositions are obtained by melt-mixing epoxy resins, hardeners, curing accelerators and other additives with heating.

However, the thus-obtained epoxy resin compositions for use in the molding of photosemiconductors are undesirable because the dispersion of each of the epoxy resin, hardener, and curing accelerator is insufficient so that these components have not been mixed uniformly at the molecular level. For this reason, if transfer molding, for example, is carried out using such an epoxy resin composition for photosemiconductor molding, the following problems result.

In producing this resin molding, when the epoxy resin composition for photosemiconductor molding is cured, the curing reaction proceeds at higher rates in some parts and at lower rates in other parts because the dispersion of each component in the epoxy resin composition is not uniform when viewed on a molecular level. Such uneven rates of the curing reaction result in unevenness in the density of the cured molding resin, and this causes the refractive index of the molding resin to vary over a wide range. The molding resin has optical unevenness which appear as a striped pattern extending in the direction of the resin flow. If, for example, an area sensor of a solid state image forming element is molded with a conventional epoxy resin composition for photosemiconductor molding by the method described above and intense parallel light rays are allowed to strike upon the molded area sensor with an iris diaphragm having f-32, such optical unevenness in the molding resin as above causes the resulting image to have a striped pattern.

SUMMARY OF THE INVENTION

Under these circumstances, the present inventors conducted a series of extensive studies in order to eliminate optical unevenness from the cured resins obtained from epoxy resin compositions for use in photosemiconductor molding. As a result, it was found that the formation of optical unevenness is greatly affected by the refractive index distribution of the cured resin. Further studies have been made with regard to refractive index distribution and, as a result, it has now been found that a cured resin with no optical unevenness ca be obtained by making the refractive index distribution curve of the cured resin sharp so as to satisfy the specific requirements (A), (B), and (C) described later. The present invention has been completed based on the above finding.

Accordingly, an object of the present invention is to provide a photosemiconductor device free from optical unevenness.

Another object of the present invention is to provide an epoxy resin composition for use in molding a photosemiconductor element to produce the above photosemiconductor device.

Other objects and effects of the present invention will be apparent from the following description.

The present invention relates to a photosemiconductor device comprising a photosemiconductor element molded with a cured transparent epoxy resin composition, the cured transparent epoxy resin composition having a refractive index distribution curve characterized by the following (A), (B), and (C):

(A) the refractive index difference X between refractive index values (b) and (c), which respectively are lower and higher than refractive index value (a) corresponding to the maximum peak of the refractive index distribution curve and respectively correspond to those points on the refractive index distribution curve which have a relative height of 20 with the height of the maximum peak being taken as 100, is 0.0018 or less;

(B) the refractive index difference Y, which is the larger one of the difference between the refractive index values (a) and (b) and the difference between the refractive index values (a) and (c), is 0.0012 or less; and (C) with the proviso that the refractive index distribution curve has other peak or peaks than the maximum peak corresponding to the refractive index value (a), the refractive index difference Z, which is the largest one of the differences between the refractive index value (a) and refractive index values (d, ... $d_n$) corresponding to the other peak or peaks, is 0.0010 or less.

DETAILED DESCRIPTION OF THE INVENTION

The present invention is described below in detail.

In the photosemiconductor device of the invention, a photosemiconductor element is molded in a cured transparent epoxy resin composition which satisfies the above requirements (A), (B) and (C).

The cured resin satisfying the requirements (A), (B), and (C) has a narrower refractive index distribution, i.e., a sharper refractive index distribution curve, than the cured resins obtained from conventional epoxy resin compositions.

Figure 1:
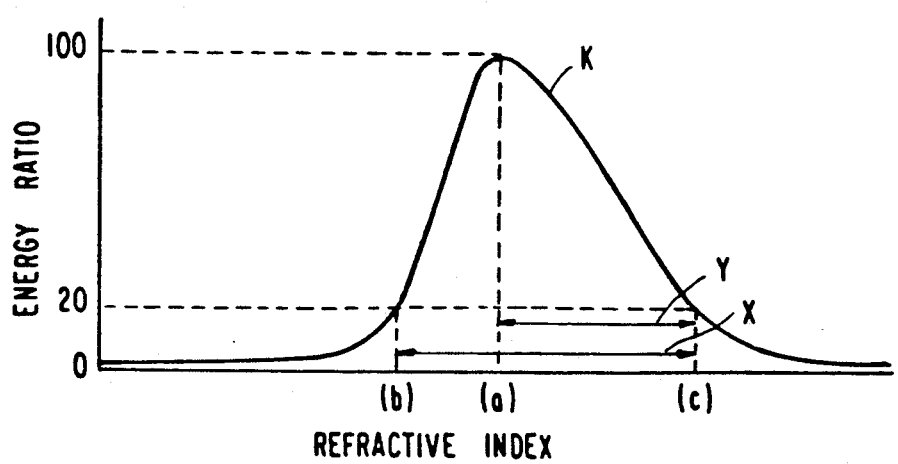
FIG. 1 is a refractive index distribution curve having a maximum peak only.

The requirements (A), (B), and (C) are explained below with reference to the drawings. In FIG. 1, which is a bell-shaped refractive index distribution curve of one example of the cured transparent epoxy resin composition employed in the present invention, K indicates the refractive index distribution curve, (a) indicates the refractive index value corresponding to the maximum peak of the distribution curve, (b) and (c) indicate refractive index values respectively corresponding to those points on the refractive index distribution curve which have a relative height of 20 with the height of the maximum peak being taken as 100 and which respectively are on the left and right of the maximum peak, X is the refractive index difference between the refractive index values (b) and (c), and Y is the refractive index difference which is the larger one of the difference between the refractive index value (a) corresponding to the maximum peak and the refractive index value (b) and the difference between the refractive index values (a) and (c) (in the figure, Y is the difference between (a) and (c) because this difference is larger than the difference between (a) and (b)).

Figure 2:
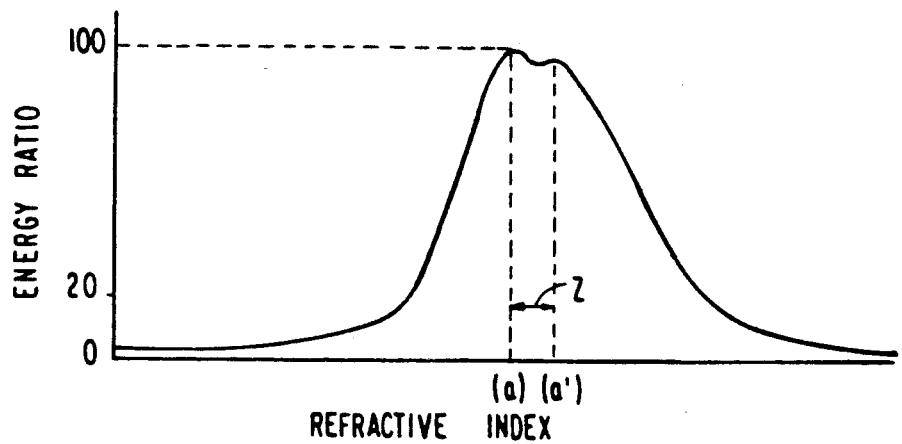
FIG. 2 is a refractive index distribution curve having the maximum peak and another peak.
Figure 3:
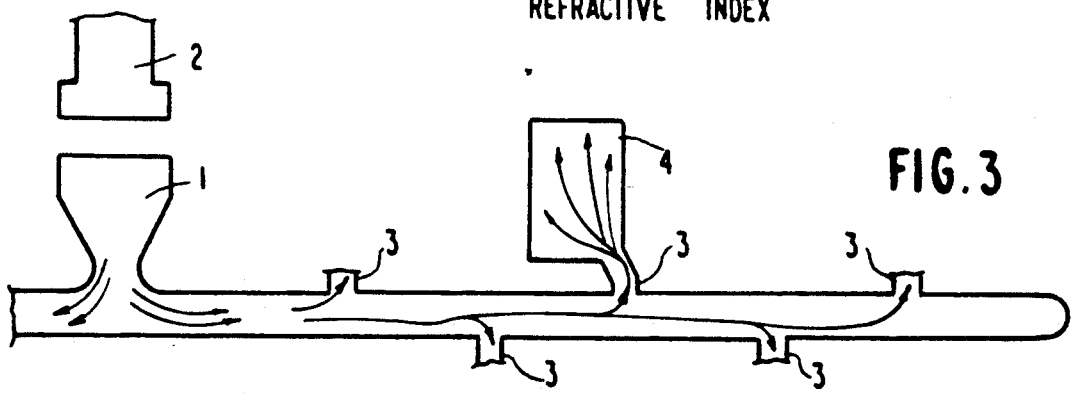
FIG. 3 is a schematic view illustrating the flow of a conventional, photosemiconductor-molding epoxy resin composition being used in transfer molding.
Figure 4:
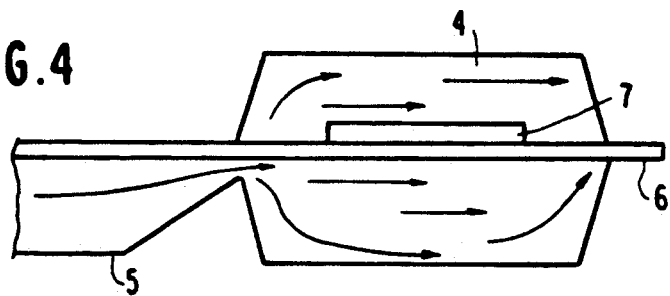
FIG. 4 is a schematic view illustrating the resin composition flow in the pivotal part of the transfer molding machine shown in FIG. 3.
Figure 7:
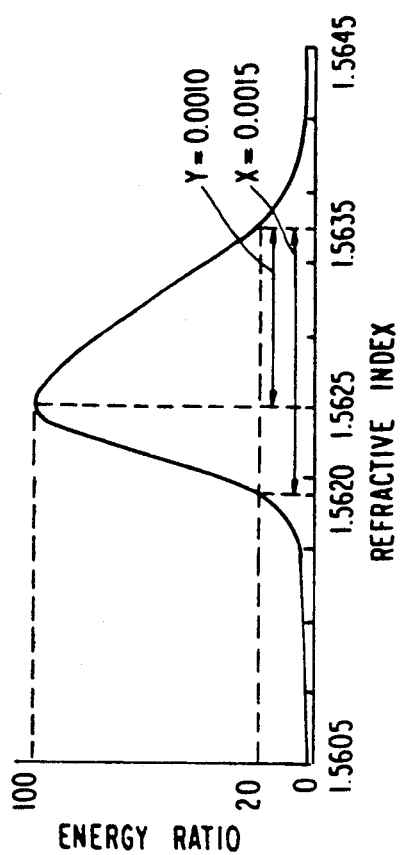
FIGS. 7, 8, 9, 10, 11, 12, and 13 show refractive index distribution curves.

Even if the refractive index distribution curve has a peak (a') other than the maximum peak (a), as shown in FIG. 2, no optical unevenness results as long as the refractive index distribution curve satisfies the above requirements (A) and (B). However, in the case where the picture element numbers for the present-day solid state image forming elements are increased greatly or such a function that a refractive index difference is emphasized by means of a microlens is imparted to photosemiconductor devices, the presence of a peak (a') other than the maximum peak (a) may cause a problem. Even in such a case where a refractive index distribution curve has two or more peaks, the cured resin can be made applicable to future solid state image forming elements which may possibly have greatly increased picture element numbers, without causing problems ascribable to optical unevenness, by regulating the refractive index difference Z, which is the largest one of the differences between the refractive index value (a) corresponding to the maximum peak and refractive index value(s) corresponding to the other peak(s) (in FIG. 2, Z is the refractive index difference between (a) and (a')), at 0.0010 or less, preferably at 0.0003 or less.

Figure 6:
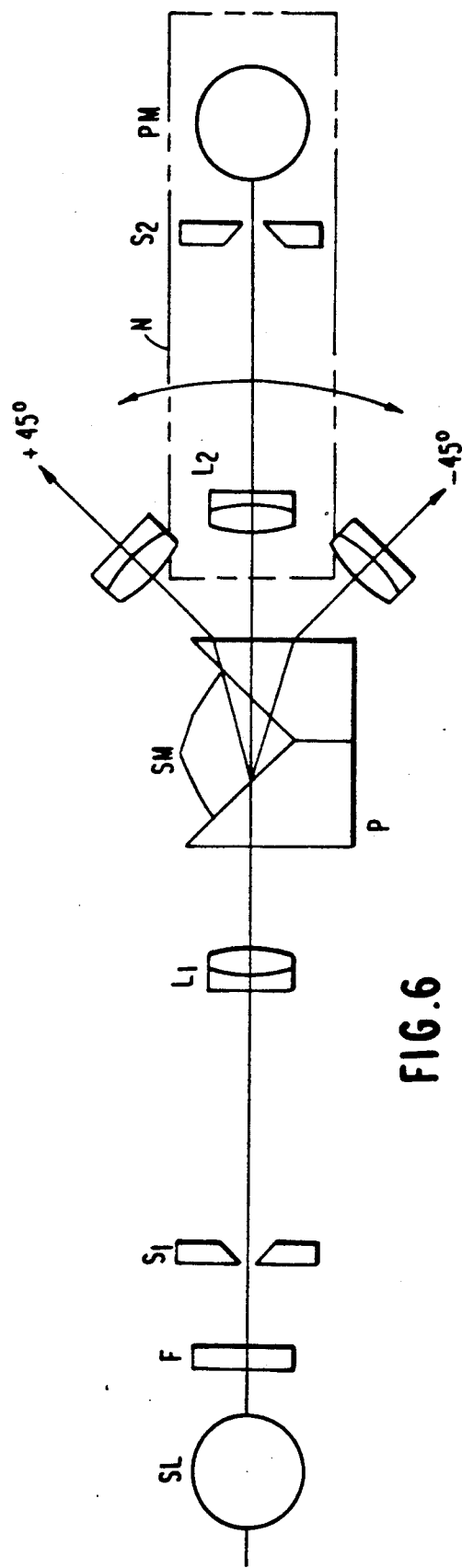
FIG. 6 is a diagrammatic view illustrating the principle in a refractive index-measuring apparatus.
Figure 8:
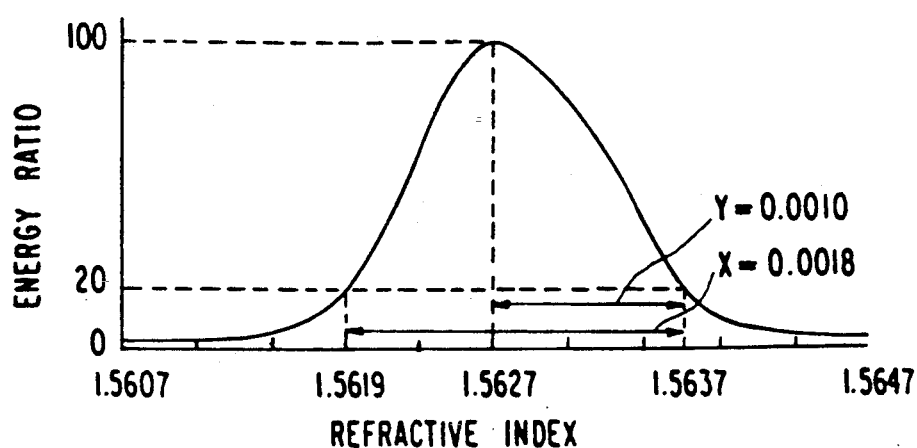

The refractive index curves shown in FIGS. 1 and 2 referred to above can be obtained by measurement with a refractive index-measuring apparatus utilizing the principle shown in FIG. 6. In FIG. 6, F indicates an interference filter, SL a spectral illuminant lamp, $S_1$ an inlet slit, $S_2$ an outlet slit, $L_1$ a collimator lens, $L_2$ a telemeter lens, P a V-block prism, SM a sample to be tested, P.M a photomultiplier, and N a telemeter part.

For measurement with this refractometer, a cured transparent epoxy resin composition is formed, for example, into a cubic sample SM, two adjacent sides of the cubic sample are polished by buffing so as to have a surface roughness of 1.5 μm or less, and this sample is set on the V-block prism P having a V-shaped depression with the polished sides of the sample being in contact with the V-shaped depression walls. Then, light is emitted from the illuminant SL. The light emitted from the illuminant SL is converted to monochromatic light by the interference filter F, and the monochromatic light passes through the inlet slit $S_1$ and then converted to parallel rays of light by the collimator lens $L_1$. The parallel light rays pass through the V-block prism P, the sample SM, and the V-block prism P in this order, while the parallel light rays are being polarized upward and downward relative to the light axis due to the difference in refractive index between the V-block prism P and the sample SM. The telemeter part N, equipped with the telemeter lens $L_2$, the outlet slit $S_2$, and the photomultiplier P.M, oscillates as shown by the arrows by means of a pulse motor (not shown) and receives the polarized light at each position in the oscillation movement, and the amount of the received light is indicated on a display (not shown) as the amount of energy. For this measurement, the relationship between refractive index and each angle in the above oscillation movement has been determined beforehand. Therefore, the amount of light received at a given angle means the amount of light refracted at an angle corresponding to that given angle.

Examples of this refractive index-measuring apparatus includes devices produced and marketed by Karunew Optics Company, Japan under the trade name of Automatic Refractometer KPR-200. The measurement of refractive index in the present invention is made by means of this refractometer with sodium D-line (587.6 nm) being used as the measuring light.

The cured transparent epoxy resin composition free of optical unevenness is one whose refractive index distribution curve obtained by the method as described above is sharp and satisfies the requirements (A), (B), and (C) described hereinabove.

An epoxy resin composition which can cure into a resin having such a sharp refractive index distribution curve may be produced, for example, by uniformly dispersing each of the constituent ingredients in the epoxy resin composition.

Examples of the technique of uniformly dispersing ingredients to produce an epoxy resin composition for use in photosemiconductor molding include: (1) a method in which a conventional powdery epoxy resin composition for molding use which has been made in the B-stage (semi-cured state) is mixed sufficiently with an organic solvent to dissolve each component, and then the organic solvent is evaporated; (2) a method in which raw ingredients such as an epoxy resin, a hardener, a curing accelerator, and others are mixed with and uniformly dissolved in an organic solvent, the resulting solution is heated so as to result in a B-stage composition, and then the solvent is evaporated; and (3) a method in which the same solution as that obtained in (2) above is prepared, subsequently the solvent is evaporated, and then the residue is heated mildly to form a B-stage composition.

In the above methods, since an epoxy resin composition or raw materials therefor are once dissolved in an organic solvent, it is possible, by the filtration of these solutions, to easily remove fine foreign substances such as dust particles, the removal of which has so far been impossible.

Furthermore, even if the refractive index distribution curve of a cured resin to be obtained from the resulting epoxy resin composition has a peak (a') other than the maximum peak (a), the other peak can be weakened by reducing the epoxy resin composition to a uniformly mixed fine powder, thereby giving a bell-shaped distribution curve having the maximum peak a only as shown in FIG. 1. The term fine powder herein normally means a powder in which particles having maximum particle-diameters of 30 μm or less, preferably 10 μm or less, comprise 90 wt % or more of the powder.

In the above method (1), a B-stage (semi-cured) epoxy resin composition is prepared by mixing the above-mentioned ingredient. As the method for mixing the ingredients, a partial reaction method (semi-curing method) and melt-mixing method are generally used. The degree of reaction of the B-stage epoxy resin composition is generally such an extent that the gelation time of the resin composition at 150° C. be from 10 to 70 seconds, and preferably from 10 to 40 seconds. Next, the B-stage epoxy resin composition is uniformly dissolved in an organic solvent. By this procedure, the ingredients of the resin composition are mixed with each other uniformly on the molecular level. The organic solvent is then removed by evaporation from the solution, and the residue is cooled to room temperature and pulverized by a conventional method. The pulverized resin composition is stamped into tablets if desired.

The degree of reaction of the thus-obtained final epoxy resin composition generally proceeds to such an extent that a transfer molding process can be carried out and that the gelation time at 150° C. is from 10 to 50 seconds, and preferably from 10 to 40 seconds. In the above method, the resin composition may be heated after removing the organic solvent in order to adjust the viscosity of the resin composition or the like. At this time, if the resin composition is heated vigorously, unevenness of the curing degree due to unevenness of the reaction rate develops. Therefore, the heating of the resin composition is preferably carried out gradually at a low temperature so that the gelation time at 150° C. is not reduced to less than 20 seconds.

In the above method (2), the ingredients are first dissolved in an organic solvent. By this procedure, the ingredients of the resin composition are mixed with each other uniformly on the molecular level. The resulting solution is heated to initiate the curing reaction so as to convert the resin composition to the B-stage. The organic solvent is then removed by evaporation from the solution, and the residue is cooled to room temperature and pulverized by a conventional method. The pulverized resin composition is stamped into tablets if desired.

In this method, the ingredients may be heated simultaneously with dissolving in the organic solvent but not heated after completion of dissolution. Alternatively, the B-stage resin composition may be further heated to heighten the degree of curing. In this method, while the resin composition may be heated after removing the organic solvent to adjust the viscosity or the like, the heating is preferably carried out gradually at a low temperature so that the gelation time at 150° C. is not reduced to less than 20 seconds.

The degree of reaction of the thus-obtained final product generally proceeds to such an extent that the gelation time at 150° C. is from 10 to 70 seconds, and preferably from 10 to 40 seconds. At this time, the extent of gelation after starting evaporation of the organic solvent is preferably controlled such that the gelation time at 150° C. is not less than 20 seconds.

In the above method (1) and (2), one, or two or more kinds of each ingredient may be used. The term "one kind" used herein includes, in the case of epoxy resins for example, bisphenol A type and bisphenol F type which have the same skeleton and are classified as the bisphenol type, and in the case of hardener, phthalic anhydride and tetrahydrophthalic anhydride which have the same skeleton and are classified as the phthalic acid type.

In the above method (3), one kind of the epoxy resin and one kind of hardener are dissolved in an organic solvent. The organic solvent is removed by evaporation from the resulting solution, and the residue is subjected to low temperature heating (low temperature aging) so as to convert the residue into the B-stage. In this method, because one kind of the epoxy resin and one kind of hardener are used, only one kind of cured product is produced. Thus, unevenness of curing degree does not appear and optical unevenness is not formed.

In this method, if the low temperature aging is carried out gradually at a low temperature so that the gelation time at 150° C. is not less than 20 seconds, optical unevenness is substantially reduced even though two or more kinds of each ingredient are used.

The degree of reaction of the thus-obtained final product generally proceeds to such an extent that the gelation time at 150° C. is from 10 to 70 seconds, and preferably from 10 to 40 seconds. At this time, the extent of gelation after starting evaporation of the organic solvent is preferably controlled such that the gelation time at 150° C. does not lower than 20 seconds.

The epoxy resin composition for photosemiconductor molding to be used for producing the photosemiconductor device of the present invention is one which is obtained by use of an epoxy resin, a hardener, and a curing accelerator, and contains no inorganic fillers such as silica powder.

As the epoxy resin, conventionally known epoxy resins may be used without any particular limitation as long as the epox used and the resulting cured composition are less apt to undergo discoloration. Examples of such epoxy resins include bisphenol A epoxy resins, bisphenol F epoxy resins, phenol-novolac epoxy resins, alicyclic epoxy resins, heterocycle-containing epoxy resins such as triglycidyl isocyanurate an-d hydantoin epoxies, hydrogenated bisphenol A epoxy resins, aliphatic epoxy resins, glycidyl ether epoxy resins, and the like. These may be used alone or in combination.

As the hardener, known hardeners for epoxy resins can be used without any particular limitation. However, acid anhydrides are advantageous in that they are less apt to cause discoloration of the resin composition during or after cure. Examples of such acid anhydrides include phthalic anhydride, maleic anhydride, trimellitic anhydride, pyromellitic anhydride, hexahydrophthalic anhydride, tetrahydrophthalic anhydride, methylnadic anhydride, nadic anhydride, glutaric anhydride, and the like. Other examples of the hardener include amine-type hardeners such as m-phenylenediamine, dimethyldiphenylmethane, diaminodiphenyl sulfone, m-xylenediamine, tetraethylenepentamine, diethylamine, propylamine, and the like, and further include phenolic resin-type hardeners. Any of these may be employed.

In the present invention, the epoxy resin is at least one of bisphenol A epoxy resin and bisphenol F epoxy resin, and the hardener is at least one of phthalic anhydride and tetrahydrophthalic anhydride.

Examples of the curing accelerator include tertiary amines, imidazole and its derivatives, metal salts of carboxylic acids, phosphorus compounds, and the like.

Besides the above-described ingredients, conventionally known additives such as anti-discoloring agents, modifiers, anti-deteriorating agents, mold-release agents, etc. may be incorporated, if required and necessary, into the epoxy resin composition of this invention for photosemiconductor molding.

As the anti-discoloring agent, conventionally known ones may be mentioned, such as phenolic compounds, amine-type compounds, organosulfur compounds, phosphine-type compounds, and the like.

The organic solvent to be used for producing the epoxy resin composition is not particularly limited as long as it is capable of completely dissolving B-stage epoxy resin compositions for photosemiconductor molding. Examples of the organic solvent include hydrocarbons such as toluene and xylene, halogenated hydrocarbons such as dichloromethane, 1,1,1-trichloroethane and 1,1,2-trichloroethane, ethers such as diethyl ether, dioxane and tetrahydrofuran, ketones such as acetone, methyl ethyl ketone and diethyl ketone, mixed solvents composed of two or more thereof, and the like.

Neither the mixing ratio of the organic solvent to the epoxy resin composition for photosemiconductor molding or the temperature for mixing is particularly limited, as long as the epoxy resin composition for photosemiconductor molding can be completely dissolved.

Generally however, the amount of the organic solvent used is preferably from 1 to 50 times by weight, more preferably from 1 to 10 times by weight, the amount of the B-stage epoxy resin composition for photosemiconductor molding. The mixing temperature is preferably kept at 100° C. or lower because too high a temperature results in gelation of the epoxy resin composition for photosemiconductor molding.

Methods for removing the organic solvent in the above processes are not particularly limited. For example, there may be employed a method in which the solvent is removed under reduced pressure at ordinary temperature or with heating according to need, or a method in which the solvent is removed by freeze drying under vacuum.

It is preferred that the amount of the organic solvent remaining unremoved should be 3% by weight or less based on the total amount of the epoxy resin composition for photosemiconductor molding. The content of the remaining organic solvent in the epoxy resin composition is more preferably 1.5% by weight or less, and particularly preferably 0.05% by weight or less. If the content of the remaining organic solvent exceeds 3% by weight, the epoxy resin composition for photosemiconductor molding tends to have a very short pot life and the cured composition tends to have a lowered glass transition temperature and hence an increased linear expansion coefficient, so that the molding resin may have impaired moisture and heat cycle resistance.

The epoxy resin composition for photosemiconductor molding obtained by the method described above is in such a state that all the components have been mixed with each other uniformly to the molecular level. Therefore, the refractive index distribution curve of the cured composition is sharp, so that the curd composition has no optical unevenness. Furthermore, since all the components are dissolved in an organic solvent during the production process and, hence, can be easily purified by suction filtration under reduced pressure or by filtration under pressure using an ordinary filter paper or the like, gel-like aggregates and foreign substances including fine dust particles present in the resin composition can be easily removed which have so far been difficult to remove.

It is preferable that the epoxy resin composition for photosemiconductor molding should be optically transparent since it is to be used in the resin molding of photosemiconductors such as photoreceiving elements. The term "transparent" used herein means that the cured resin obtained from the epoxy resin composition for photosemiconductor molding has a transmittance of generally 90% or higher, preferably 95% or higher, more preferably 98% or higher, as measured at 600 nm with the cured resin thickness being 1 mm.

The meaning of "ingredients being mixed with each other uniformly to the molecular level" is as follows. The resin composition is transfer molded at 150° C. for 6 minutes and then hardened at 150° C. for 3 hours. The hardened resin composition is taken out from the runner portion of the molding die, and formed into a flat plate (thickness: 3.0 mm, width: 5 mm) having a branch perpendicular to the flat plate, the surface of which is polished to have a surface roughness of 1.5 μm or less. The plate of the cured resin composition is equipped on a solid state image forming element (½ inch, 380,000 picture elements). Intense parallel light rays having a luminous intensity of 10 candelas are allowed to strike the image forming element with an iris diaphragm of f-32. If no striped interference pattern is observed the composition is "mixed uniformly on the molecular level".

Molding of photoreceiving elements or other photosemiconductors with the epoxy resin composition is not particularly limited, and can be carried out by known molding techniques such as, for example, ordinary transfer molding. In practicing the transfer molding, a molding resin composition in a powder form is normally used after being tableted at ordinary temperature.

In the transfer molded resin composition of the present invention, because the ingredients are mixed with each other uniformly to the molecular level, curing unevenness and optical unevenness are not produced although such unevenness is formed in conventional resin compositions.

Figure 5:
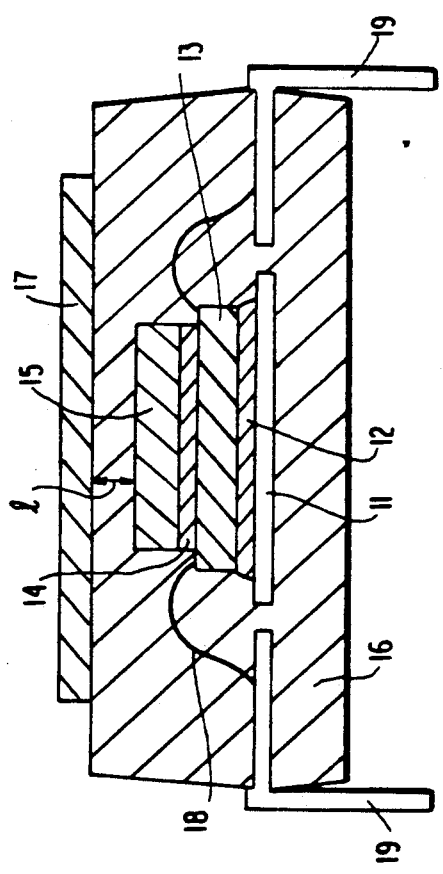
FIG. 5 is a vertical sectional view of a photosemiconductor device molded in an epoxy resin composition of this invention for photosemiconductor molding.

The photosemiconductor device thus obtained, for example, has a structure as shown in FIG. 5, in which an image-pickup solid element 13 as a photoreceiving element is mounted on a bonding pad 11 through an adhesive 12, and a color filter 15 is bonded to the upper side of the photoreceiving element by means of a transparent adhesive 14, with this assembly being resin-molded in an epoxy resin composition 16 for photosemiconductor molding. The color filter 15 has been provided in order to obtain color images, and is unnecessary for monochromatic images. In the figure, numeral 17 denotes a glass plate, 18 a bonding wire, and 19 a lead frame.

Since this photosemiconductor device has been resin-molded in a photosemiconductor-molding epoxy resin composition in which all the components thereof have been mixed uniformly to the molecular level, the refractive index distribution curve of the molding resin 16 is sharp, so that the molding resin 16 has no optical unevenness. Therefore, images obtained by operating this device are free from striped patterns ascribable to optical unevenness and black spots due to inclusion from foreign particles. The freedom of optical unevenness has been ascertained with photosemiconductor devices obtained by regulating the thickness 1 of the molding resin over the color filter 15 at ordinary values, i.e., 0.5 to 2 mm.

As described above, the photosemiconductor device of the present invention is free of optical unevenness because the refractive index distribution curve of the cured transparent epoxy resin composition is characterized by (A), (B), and (C) described hereinabove. Furthermore, in the case where the cured transparent epoxy resin is obtained from an epoxy resin composition which has undergone a dissolution in an organic solvent, foreign substances can be removed from the resin composition by filtration, so that the cured resin can be made free of gel-like aggregates and foreign substances, such as fine dust particles, present in the resin composition, although these impurities have so far been difficult to remove. Thus, the resin composition can be of high quality. Therefore, such a high-quality epoxy resin composition is used for resin-molding of a photoreceiving element such as solid state image forming element or the like to produce a photosemiconductor device of the present invention, the images formed by the photosemiconductor device are free from striped patterns ascribable to optical unevenness of molding resin or black spots ascribable to foreign substances present in molding resin. That is, the photosemiconductor device of the present invention, although being of a resin-molded type, has high performance that is equal to or higher than those of ceramic-packaged types.

The present invention will be explained below in more detail by reference to the following Examples and Comparative Examples, but the Examples should not be construed to be limiting the scope of the invention. Hereinafter, all parts are by weight.

EXAMPLE 1 TO 4 AND COMPARATIVE EXAMPLES 1 TO 3

For use in the Examples and Comparative Examples, epoxy resin compositions A to G were prepared beforehand by the methods given below in which the six formulations shown in Table 1 were used. In Table 1, the formulations are indicated in terms of part by weight.

TABLE 1

| Formulation | Epoxy resin | | Hardener tetrahydrophthalic anhydride[*3] | Catalyst[*4] |
| --- | --- | --- | --- | --- |
| | Epikote 1001[*1] | Triglycidyl isocyanurate[*2] | | |
| 1 | 75 | 25 | 52.0 | 0.3 |
| 2 | 75 | 25 | 51.9 | 0.3 |
| 3 | 75 | 25 | 51.8 | 0.3 |
| 4 | 75 | 25 | 51.7 | 0.3 |
| 5 | 75 | 25 | 51.4 | 0.3 |
| 6 | 75 | 25 | 51.0 | 0.3 |

Note
[*1] Manufactured by Yuka Shell Epoxy K.K., Japan
[*2] Manufactured by Nissan Chemical Industries, Ltd., Japan
[*3] Manufactured by Hitachi Chemical Co., Ltd., Japan
[*4] "2E4MZ" manufactured by Shikoku Chemical Co., Ltd., Japan Epoxy Resin Composition A The ingredients shown under formulation 1 in Table 1 were melt-mixed with heating in the respective proportions shown in the table, and then the mixture was allowed to undergo curing reactions of the epoxy resins, thereby preparing a B-stage epoxy resin composition for photosemiconductor molding which composition had a gelation time as measured at 150° C. of 30 seconds. This B-stage epoxy resin composition for photosemiconductor molding was completely dissolved in the organic solvent whose kind and amount are shown in Table 2 given later, and then the solvent was removed under reduced pressure, while the solution was being heated at 45° C. The resulting residue was reduced to powder to obtain photosemiconductor-molding epoxy resin composition A in a powder form (for Example 1) having the residual organic solvent content as shown in Table 2 and a gelation time as measured at 150° C. of 25 seconds.

Epoxy Resin Composition B

Two compositions were prepared according to formulations 1 and 3, respectively, as shown in Table 1. Each of the two compositions was allowed to undergo curing reactions of the epoxy resins thereby to prepare, from each composition, a B-stage epoxy resin composition for photosemiconductor molding which composition had a gelation time as measured at 150° C. of 30 seconds. 50 Parts each of the thus-prepared two kinds of B-stage epoxy resin compositions for photosemiconductor molding were blended with each other, and the blend was mixed with and completely dissolved in the organic solvent whose kind and amount are shown in Table 2. The solvent was then removed under reduced pressure, while the solution was being heated at 45° C. The resulting residue was reduced to powder to obtain photosemiconductor-molding epoxy resin composition B in a powder form (for Example 2) having the residual organic solvent content as shown in Table 2 and a gelation time as measured at 150° C. of 25 seconds. Epoxy Resin Composition C The ingredients shown under formulation 2 in Table 1 were melt-mixed with heating, and then the mixture was allowed to undergo curing reactions of the epoxy resins, thereby preparing a B-stage epoxy resin composition for photosemiconductor molding which composition had a gelation time as measured at 150° C. of 30 seconds. This B-stage epoxy resin composition for semiconductor molding was mixed with and completely dissolved in the organic solvent whose kind and amount are shown in Table 2. The solvent was then removed under reduced pressure, while the solution was being heated at 45° C. The resulting residue was reduced to powder to obtain photosemiconductor-molding epoxy resin composition in a powder form having the residual organic solvent content as shown in Table 2 and a gelation time as measured at 150° C. of 25 seconds. 40 Parts of this epoxy resin composition was dryblended with 60 parts of the above-described epoxy resin composition A to obtain photosemiconductor-molding epoxy resin composition C (for Example 3).

Epoxy Resin Composition D

The ingredients shown under formulation 4 in Table 1 were melt-mixed with heating, and then the mixture was allowed to undergo curing reactions of the epoxy resins, thereby preparing a B-stage epoxy resin composition for photosemiconductor molding which composition had a gelation time as measured at 150° C. of 30 seconds. This B-stage epoxy resin composition for photosemiconductor molding was mixed with and completely dissolved in the organic solvent whose kind and amount are shown in Table 2. The solvent was then removed under reduced pressure, while the solution was being heated at 45° C. The resulting residue was reduced to powder to obtain photosemiconductor-molding epoxy resin composition in a powder form having the residual organic solvent content as shown in Table 2 and a gelation time as measured at 150° C. of 25 seconds. 40 Parts of this epoxy resin composition was dryblended with 60 parts of the above-described epoxy resin composition A to obtain photosemiconductor-molding epoxy resin composition D (for Example 4).

Epoxy Resin Composition E

The ingredients shown under formulation 5 in Table 1 were melt-mixed with heating without using an organic solvent, and then the mixture was allowed to undergo curing reactions of the epoxy resins. The resulting mixture was reduced to powder to obtain photosemiconductor-molding epoxy resin composition E in a powder form (for Comparative Example 1) having a gelation time as measured at 150° C. of 25 seconds.

Epoxy Resin Composition F

The ingredients shown under formulation 5 in Table 1 were melt-mixed with heating, and then the mixture was allowed to undergo curing reactions of the epoxy resins, thereby preparing a B-stage epoxy resin composition for photosemiconductor molding which composition had a gelation time as measured at 150° C. of 30 seconds. This composition was reduced to powder. 35 Parts of the thus-obtained powdery epoxy resin composition was dryblended with 65 parts of the above-described composition A to obtain epoxy resin composition F (for Comparative Example 2).

Epoxy Resin Composition G

The ingredients shown under formulation 6 in Table 1 were melt-mixed with heating, and then the mixture was allowed to undergo curing reactions of the epoxy resins, thereby preparing a B-stage epoxy resin composition for photosemiconductor molding which composition had a gelation time as measured at 150° C. of 30 seconds. This composition was reduced to powder. 20 Parts of the thus-obtained powdery epoxy resin composition was dryblended with 80 parts of the above-described epoxy resin composition A to obtain epoxy resin composition G (for Comparative Example 3).

means of a refractometer (Automatic Refractometer KPR-200 manufactured by Karunew Optics Company).

The results of the refractive index measurement on these samples A to G are shown in FIGS. 7 to 13, respectively; samples A to D are for Examples, while samples E to G are for Comparative Examples.

Figure 9:
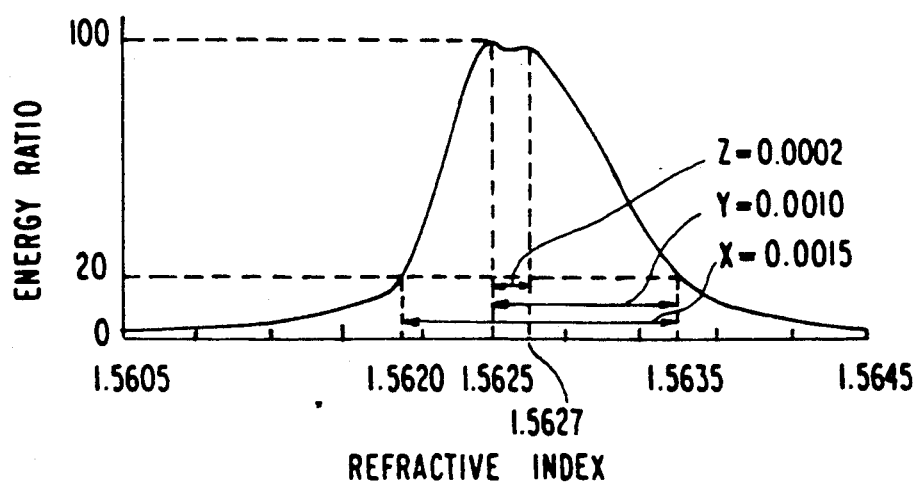
Figure 10:
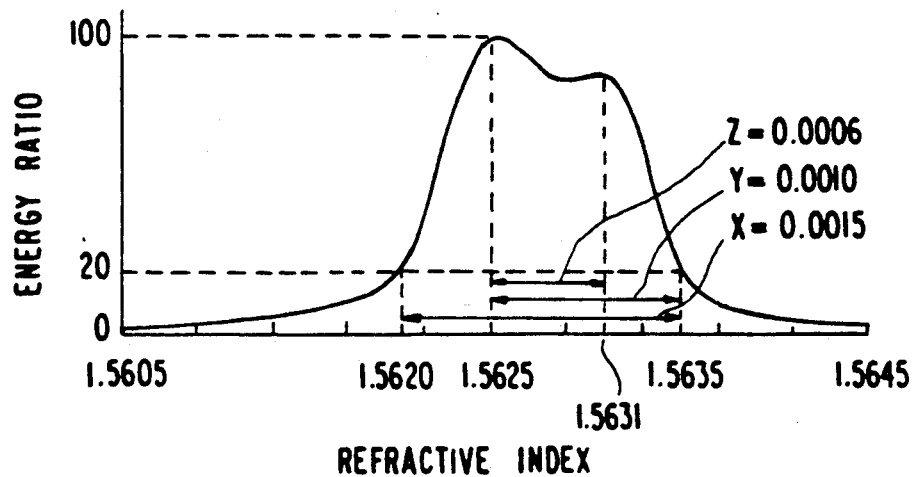
Figure 11:
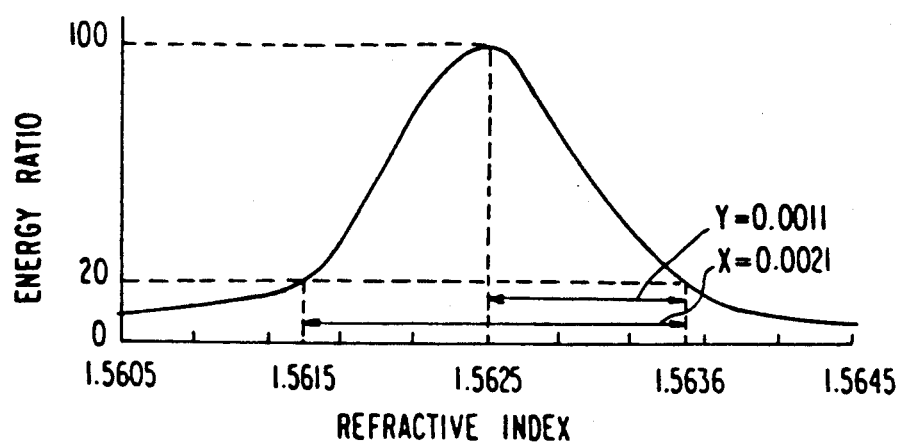
Figure 12:
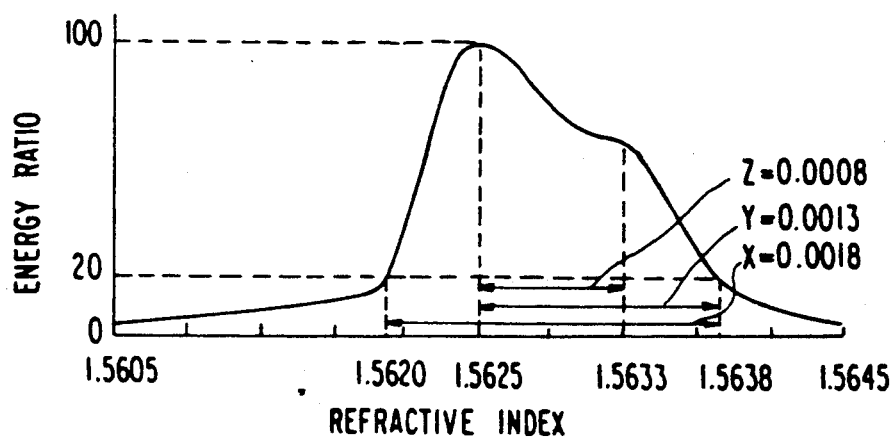
Figure 13:
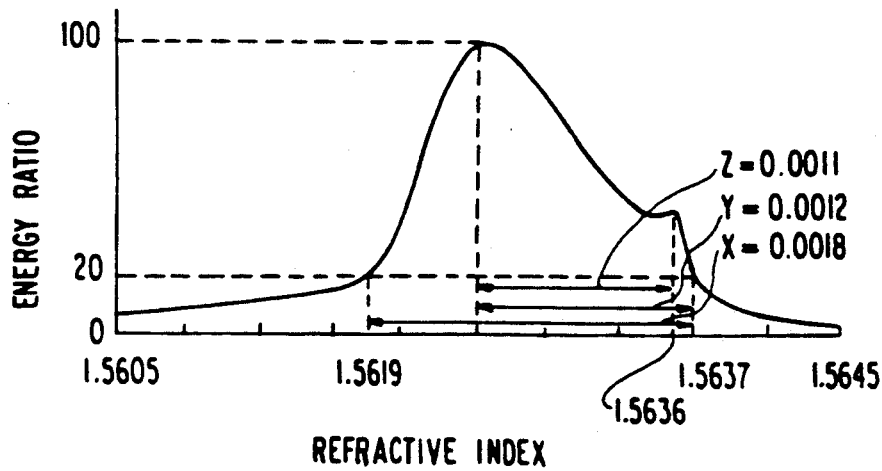

It is apparent, from the refractive index distribution curves for samples A to D as shown in FIGS. 7 to 10 and from the values of X, Y, and Z in Table 2, that samples A to D satisfy requirements (A), (B), and (C) which are essential in the present invention. In particular, in the case of samples C and D, the refractive index distribution curves as shown in FIGS. 9 and 10 have peaks other than the maximum peaks, but the refractive index differences Z between the refractive index value (a) corresponding to the maximum peak and the refractive index value (a') corresponding to the other peak are within the specific range, i.e., 0.0010 or less, as apparent from FIGS. 9 and 10 and the values of Z in Table 2. By contrast, comparative samples E and F do not satisfy requirement (A) or (B) described hereinabove as apparent from the refractive index distribution curves shown in FIGS. 11 and 12 and from the values of X and Y shown in Table 2. The other comparative sample G satisfies requirements (A) and (B) as seen from the refractive index distribution curve shown in FIG. 13 and from the values of X and Y in Table 2, but the refractive index difference Z between the refractive index value (a) corresponding to the maximum peak and the refractive index value (a') corresponding to the other peak is above 0.0010. That is, sample G does not satisfy requirement (C) described hereinabove.

(Preparation of Photosemiconductor Device)

Using each of the seven kinds of powdery epoxy resin compositions (A to G), a photosemiconductor device

TABLE 2

| | Example | | | | Comparative Example | | |
|---|---|---|---|---|---|---|---|
| | 1 | 2 | 3 | 4 | 1 | 2 | 3 |
| Epoxy resin composition (part by weight) | A | B | C | D | E | F | G |
| Organic solvent (dichloromethane) (part by weight) | 500 | 500 | 500 | 500 | — | — | — |
| Residual organic solvent content (wt %) | 1 | 1 | 1 | 1 | — | 0.65 | 0.80 |
| Refractive index difference X | 0.0015 | 0.0018 | 0.0015 | 0.0015 | 0.0021 | 0.0018 | 0.0018 |
| Refractive index difference Y | 0.0010 | 0.0010 | 0.0010 | 0.0010 | 0.0010 | 0.0013 | 0.0012 |
| Refractive index difference Z | — | — | 0.0002 | 0.0006 | — | 0.0008 | 0.0011 |
| Optical unevenness A | none | none | none | none | present | present | present |
| Optical unevenness B | none | slightly present | none | slightly present | present | present | present |

(Refractive Index Measurement)

Each of the seven kinds of powdery epoxy resin compositions (A to G) obtained by the methods described above were formed into tablets. Each tableted composition was subjected to transfer molding at 150° C. for 6 minutes to form a cube, which was then cured at 150° C. for 3 hours. Thus, seven cured cubes each measuring 1×1×1 cm were prepared from the seven kinds of compositions. With respect to each of these cured cubes, two adjacent sides were polished by buffing so that the polished surfaces had surface roughnesses of 1.5 μm or less. The thus-obtained cubic samples (A to G) were examined for refractive index distribution by was prepared by actually subjecting an area sensor, which is an image-pickup solid element, to direct molding at 150° C. for 6 minutes, followed by postcure at 150° C. for 3 hours. Using this photosemiconductor device, a camera was constructed. Upon this camera, intense parallel rays of light (luminous intensity: 10 candelas) were allowed to strike at a right angle, and images taken at an iris of f-32 were projected on a display. As a result, the four kinds of cameras constructed in Examples respectively using compositions A to D gave images free from optical unevenness as shown in Table 2 (Optical unevenness A). By contrast, in the case of the three kinds of cameras of Comparative Examples constructed by using compositions E to G, respectively, optical unevenness was observed on the images with part of the images having a striped pattern.

Furthermore, using each of the runner-shaped plates (thickness 3.0 mm, width 5 mm) which remained in the runner part of the mold after the direct molding described above, occurrence of optical unevenness was examined as follows. That is, a runner-shaped plate which had a surface polished to a surface roughness of 1.5 μm or less and had a part curved at 120° was placed on a molded area sensor which was an solid state image forming element of the type having 380,000 picture elements per ½ inch and which had been incorporated into a camera, and then intense parallel light rays were allowed to strike upon the plate at a right angle to examine the resulting images for a striped pattern at an iris of f-32.

In view of the fact that sample polymers formed in the runner part were as thick as 3.0 mm and were hence more apt to cause a striped pattern, this optical unevenness test is more severe than the above-described optical unevenness evaluation and can be thought to be a test whether the sample would be applicable to future solid state image forming elements expected to have an increased number of picture elements. As a result, the resin plates of Examples 1 and 3 obtained from the above- described epoxy resin compositions A and C, respectively, caused no striped pattern on the images taken by the cameras, i.e., the two resin plates were free from optical unevenness, while the resin plates of Examples 2 and 4 obtained from compositions B and D, respectively, caused striped patterns to a slight degree, as shown in Table 2 (Optical unevenness B). In contrast thereto, all of the resin plates of Comparative Examples respectively obtained from compositions E to G caused striped patterns.

While the invention has been described in detail and with reference to specific embodiments thereof, it will be apparent to one skilled in the art that various changes and modifications can be made therein without departing from the spirit and scope thereof.

What is claimed is:

1. A photosemiconductor device comprising a photosemiconductor element molded with a cured transparent epoxy resin composition, said cured transparent epoxy resin composition having a refractive index distribution curve characterized by the following (A), (B), and (C):

(A) a refractive index difference X between refractive index values (b) and (c), which respectively are lower and higher than refractive index value (a) corresponding to a maximum peak of said refractive index distribution curve, and which respectively correspond to those points on said refractive index distribution curve which have a relative height of 20, with the height of said maximum peak being taken as 100, is 0.0018 or less;

(B) a refractive index difference Y, which is the larger value of the difference between said refractive index values (a) and (b) and the difference between said refractive index values (a) and (c), is 0.0012 or less; and (C) with the proviso than when said refractive index distribution curve has an additional peak or peaks other than said maximum peak corresponding to said refractive index value (a), a refractive index difference Z, which is the largest value of the differences between said refractive index value (a) and refractive index values $(d, \ldots d_n)$ corresponding to said other peak or peaks, is 0.0010 or less.

2. A photosemiconductor device as claimed in claim 1, wherein said refractive index difference Z in requirement (C) is 0.0003 or less.

3. A photosemiconductor device comprising a photosemiconductor element and a molding resin in which said photosemiconductor element is molded, said molding resin being one formed by curing a B-stage epoxy resin composition for use in molding photosemiconductors, said B-stage epoxy resin composition comprising an epoxy resin, a hardener, and a curing accelerator as constituent ingredients, wherein said constituent ingredients are mixed with each other uniformly to the molecular level; and said cured B-stage transparent epoxy resin composition has a refractive index distribution curve characterized by the following (A), (B), and (C):

(A) a refractive index difference X between refractive index values (b) and (c), which respectively are lower and higher than refractive index value (a) corresponding to a maximum peak of said refractive index distribution curve, and which respectively correspond to those points on said refractive index distribution curve which have a relative height of 20, with the height of said maximum peak being taken as 100, is 0.0018 or less;

(B) a refractive index difference Y, which is the larger value of the difference between said refractive index values (a) and (b) and the difference between refractive index values (a) and (c), is 0.0012 or less; and (C) with the proviso that when said refractive index distribution curve has an additional peak or peaks other than said maximum peak corresponding to said refractive index value (a), a refractive index difference Z, which is the largest value of the differences between said refractive index value (a) and refractive index values $(d, \ldots d_n)$ corresponding to said other peak or peaks, is 0.0010 or less.

4. An epoxy resin composition for use in molding photosemiconductors, produced by a process comprising: dissolving into an organic solvent a B-stage epoxy resin composition comprising an epoxy resin, a hardener, and a curing accelerator, and removing the organic solvent until the amount of said organic solvent remaining is 3% by weight or less based on the total amount of said B-stage epoxy resin composition, and wherein said B-stage epoxy resin composition has a refractive index distribution curve characterized by the following (A), (B), and (C):

(A) a refractive index difference X between refractive index values (b) and (c), which respectively are lower and higher than refractive index value (a) corresponding to a maximum peak of said refractive index distribution curve, and which respectively correspond to those points on said refractive index distribution curve which have a relative height of 20, with the height of said maximum peak being taken as 100, is 0.0018 or less;

(B) a refractive index difference Y, which is the larger value of the difference between said refractive index values (a) and (b) and the difference between said refractive index values (a) and (c), is 0.0012 or less; and (C) with the proviso that when said refractive index distribution curve has an additional peak or peaks other than said maximum peak corresponding to said refractive index value (a), a refractive index difference Z, which is the largest value of the differences between said refractive index value (a) and refractive index values (d, ... $d_n$) corresponding to said other peak or peaks, is 0.0010 or less.

5. An epoxy resin composition for use in molding photosemiconductors, produced by a process comprising: dissolving an epoxy resin, a hardener, and a curing accelerator into an organic solvent, and removing said organic solvent until the amount of said organic solvent remaining is 3% by weight or less based on the total amount of said B-stage epoxy resin composition, and wherein said B-stage epoxy resin composition has a refractive index distribution curve characterized by the following (A), (B), and (C):

(A) a refractive index difference X between refractive index values (b) and (c), which respectively are lower and higher than refractive index value (a) corresponding to a maximum peak of said refractive index distribution curve, and which respectively correspond to those points on said refractive index distribution curve which have a relative height of 20, with the height of said maximum peak being taken as 100, is 0.0018 or less;

(B) a refractive index difference Y, which is the larger value of the difference between said refractive index values (a) and (b) and the difference between said refractive index values (a) and (c), is 0.0012 or less; and (C) with the proviso than when said refractive index distribution curve has an additional peak or peaks other than said maximum peak corresponding to said refractive index value (a), a refractive index difference Z, which is the largest value of the differences between said refractive index value (a) and refractive index values (d, ... $d_n$) corresponding to said other peak or peaks, is 0.0010 or less.

6. An epoxy resin composition as claimed in claim 5, further comprising heating said dissolved epoxy resin, hardener, and curing accelerator to allow the curing reaction of the epoxy resin to proceed.

7. An epoxy resin composition as claimed in claim 5, wherein said organic solvent is removed without allowing said B-stage epoxy resin to undergo a reaction, and then allowing residual epoxy resin composition to cure.

8. An epoxy resin composition as claimed in claim 5, wherein said B-stage epoxy resin is selected from the group consisting of bisphenol A epoxy resins and bisphenol F epoxy resins, and said hardener is selected from the group consisting of phthalic anhydride and tetrahydrophthalic anhydride.

9. An epoxy resin composition as claimed in claim 4, wherein the amount of said organic solvent remaining is 1.5% by weight or less based on the total amount of said B-stage epoxy resin composition.

10. An epoxy resin composition as claimed in claim 5, wherein the amount to the organic solvent remaining is 1.5% by weight or less based on the total amount of said B-stage epoxy resin composition.

11. An epoxy resin composition as claimed in claim 4, wherein the amount of the organic solvent remaining is 0.05% by weight or less based on the total amount of said B-stage epoxy resin composition.

12. An epoxy resin composition as claimed in claim 5, wherein the amount of the organic solvent remaining is 0.05% by weight or less based on the total amount of said B-stage epoxy resin composition.

* * * * *